United States Patent [19]
Manabe et al.

[11] Patent Number: 5,513,138
[45] Date of Patent: Apr. 30, 1996

[54] MEMORY CARD HAVING A PLURALITY OF EEPROM CHIPS

[75] Inventors: Katsuhiko Manabe, Machida; Hiroki Fukuoka, Kawasaki, both of Japan

[73] Assignee: Ricoh Co., Ltd., Tokyo, Japan

[21] Appl. No.: 224,270

[22] Filed: Apr. 7, 1994

[30] Foreign Application Priority Data

May 13, 1993 [JP] Japan .................................. 5-111632

[51] Int. Cl.⁶ ................................................. G11C 11/34
[52] U.S. Cl. ............................ 365/185.33; 365/185.11; 365/200; 365/52; 365/230.03
[58] Field of Search .................................. 365/185, 218, 365/900, 230.03, 52, 185.33, 200, 185.11

[56] References Cited

U.S. PATENT DOCUMENTS 5,303,198  4/1994  Adachi et al. ............................ 365/218
5,388,248  2/1995  Robinson et al. ................... 365/900 X

FOREIGN PATENT DOCUMENTS 3-265287  11/1991  Japan .
4-268284   9/1992  Japan .

Primary Examiner—David C. Nelms
Assistant Examiner—Huan Hoang
Attorney, Agent, or Firm—Cooper & Dunham

[57] ABSTRACT

A data writing operation of a memory card is performed from a first EEPROM chip. Writing commands are given every time data in a memory block unit are completely transferred. Each of four EEPROM chips is performing the writing operation when data of the four EEPROM chips are completely written to the memory card. A systematic side waits for the next data transfer in view of an RDY/BSY signal of the memory card. The data writing operation from the systematic side to each of the four EEPROM chips is sequentially changed by monitoring an RDY/BSY1 signal of the first EEPROM chip. In this construction of the memory card, data can be preferably written and read from the memory card at a high speed.

23 Claims, 4 Drawing Sheets

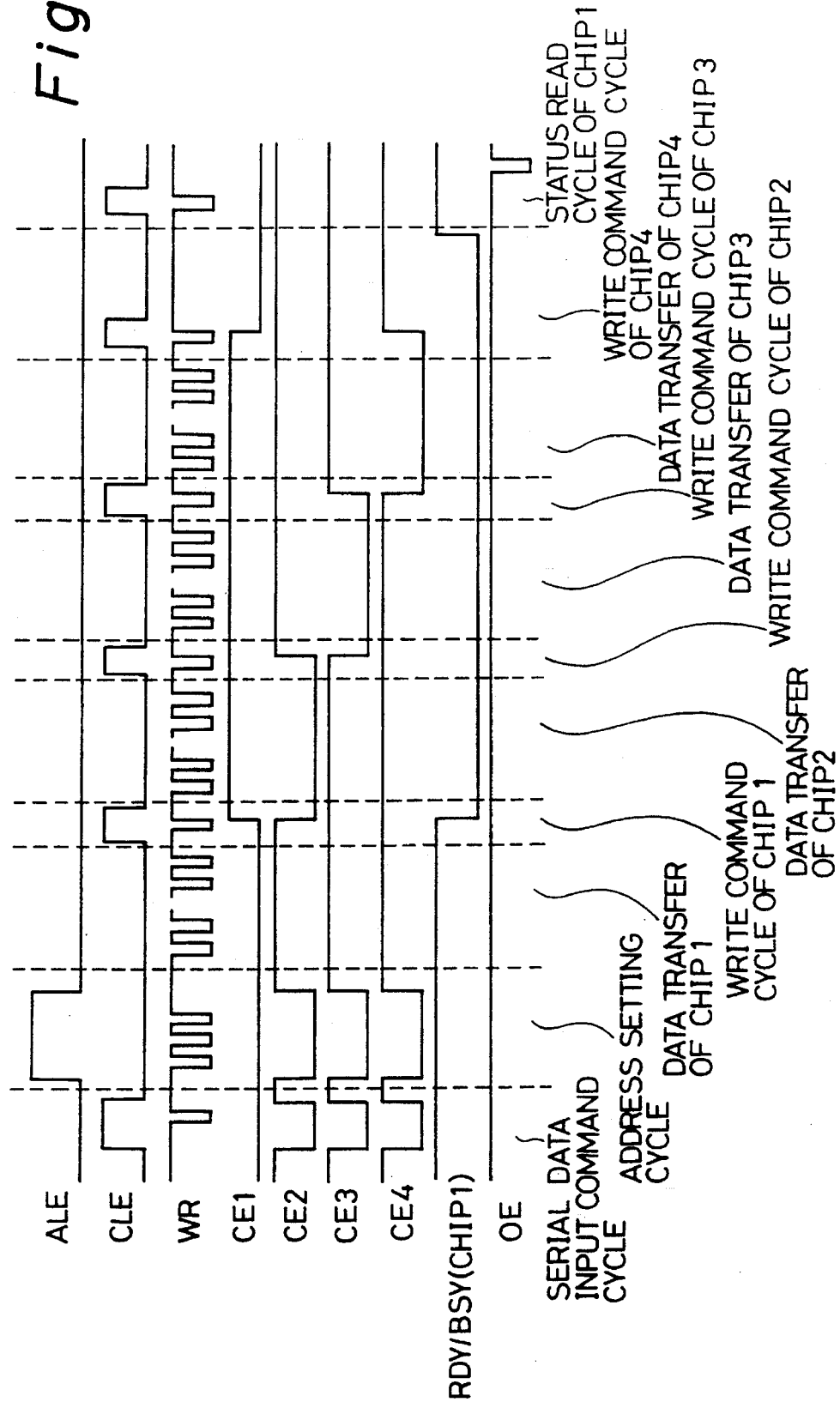

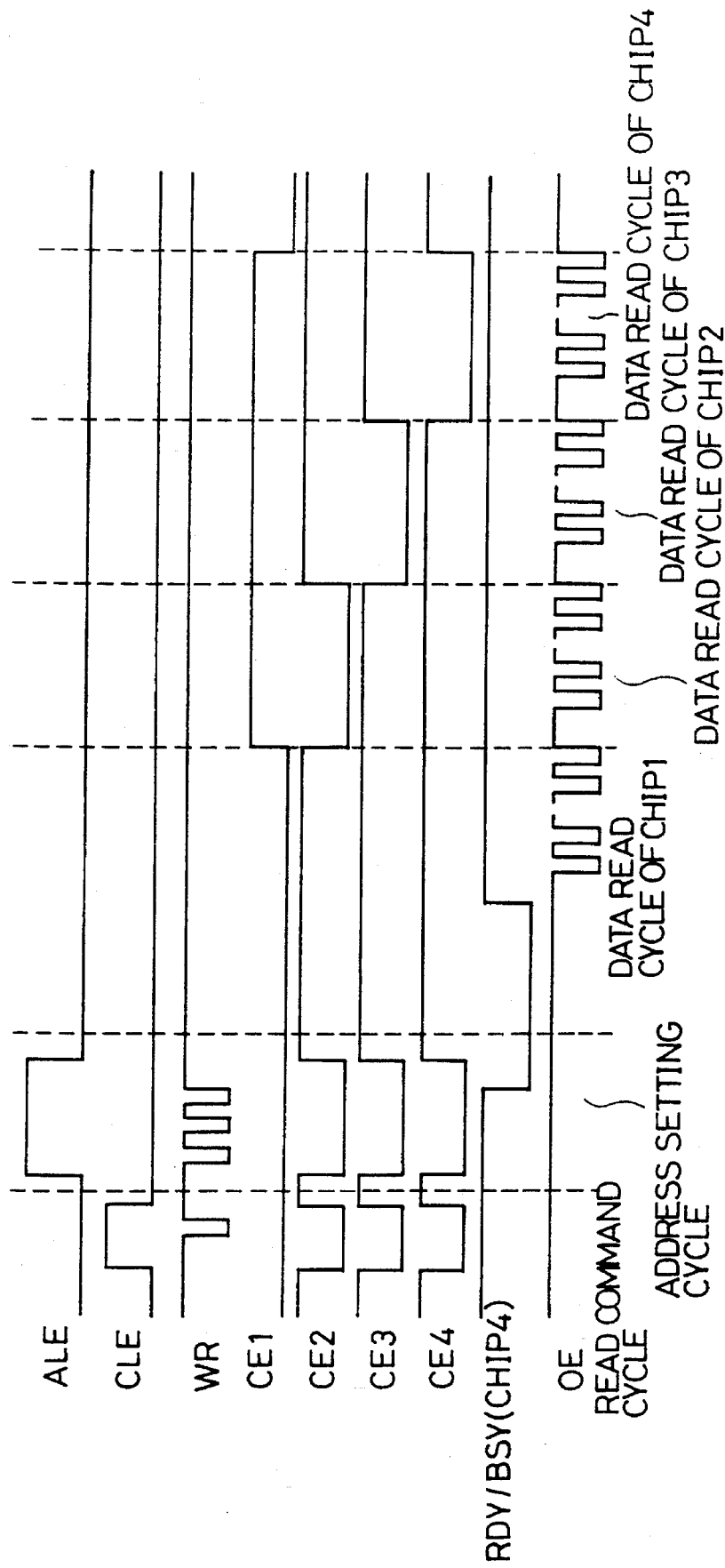

MEMORY CARD HAVING A PLURALITY OF EEPROM CHIPS

BACKGROUND OF THE INVENTION

1. Field of the Invention

The present invention relates to a memory card having a plurality of electrically erasable type PROMs (EEPROMs).

2. Description of the Related Art

When a memory card is constructed by using a flash type EEPROM chip as a memory medium, the memory card can have a large capacity at a relatively low cost. However, the speed of a data writing operation of the EEPROM chip is low so that no high speed writing operation such as a writing operation of data of a compressed moving picture in real time can be realized at present.

For example, each of Japanese Patent Application Laying Open (KOKAI) Nos. 3-265287 and 4-268284 shows a technique for solving this problem. Japanese Patent Application Laying Open (KOKAI) No. 3-265287 shows a region for recording information indicative of the position of an empty unit recording region to be first recorded when image data are recorded to a semiconductor memory of a memory card. A writing speed of data is increased by retrieving the empty unit recording region for a short time. In Japanese Patent Application Laying Open (KOKAI) No. 4-288284, image information is written to a plurality of EEPROMs in parallel with each other so that each of the EEPROMs operated at a low speed can be used in real time as a high speed image recording medium.

However, write times of the EEPROMs are generally dispersed in accordance with EEPROM chips. Further, a write time of each of the EEPROMs is dispersed within the same EEPROM chip. Therefore, no efficient high speed writing operation can be performed even when a parallel writing technique is simply used. Accordingly, it is necessary to use a writing control system in which dispersion in performance of each of the EEPROM chips is considered.

In the case of the flash type EEPROM, the number of writing operations is limited so that a defective bit is caused when the flash type EEPROM is used for a long period. Therefore, it is necessary to arrange a certain defective control means so as to recognize a defective area on a systematic side within the memory card. However, in a general memory structure, defective information is simply stored to a certain area or region of a memory of the same kind, concretely, a file control area.

In general, the file control area in the memory is an area often accessed in comparison with a data area. Therefore, there is a high possibility that the file control area itself first becomes defective. Accordingly, when the file control area becomes defective within the memory card in such a memory structure, there is a problem that previously recorded data are invalidated after the file control area has become defective.

SUMMARY OF THE INVENTION

It is therefore an object of the present invention to provide a memory card for preferably writing and reading data therefrom at a high speed.

In accordance with a first construction of the present invention, the above object can be achieved by a memory card having a plurality of EEPROM chips each capable of reading and writing data in a memory block unit; the memory card comprising means for controlling plural parallel writing operations in the block unit to perform a data writing operation at a high speed; the memory card being constructed such that a signal indicative of the writing operation can be outputted to an exterior portion of the memory card and it can be monitored whether the writing operation is performed for each of the EEPROM chips.

In accordance with a second construction of the present invention, a writing state of an EEPROM chip firstly writing a signal for outputting contents indicative of the writing operation to the memory card exterior can be monitored.

In accordance with a third construction of the present invention, a writing state of each of the EEPROM chips can be monitored from a data bus of the memory card.

In accordance with a fourth construction of the present invention, the memory card further comprises means for independently setting writing commands to each of the EEPROM chips.

In accordance with a fifth construction of the present invention, the memory card further comprises means for switching an enable operation of each of the EEPROM chips based on a counting value of the writing commands to continuously perform the writing operation in a unit of plural memory blocks at a data writing time.

In accordance with a sixth construction of the present invention, the above object can be also achieved by a memory card having a plurality of EEPROM chips each capable of reading and writing data in a memory block unit; the memory card comprising means for selecting each of the EEPROM chips to enable a continuous block reading operation.

In accordance with a seventh construction of the present invention, address setting means for setting a memory address to each of the EEPROM chips is commonly arranged with respect to each of the EEPROM chips.

In accordance with an eighth construction of the present invention, command setting means for setting specified commands to each of the EEPROM chips is commonly arranged with respect to each of the EEPROM chips.

In accordance with a ninth construction of the present invention, the memory card further comprises means for setting commands for checking an operating status of each of the EEPROM chips independently with respect to each of the EEPROM chips.

In accordance with a tenth construction of the present invention, a signal provided by carrying out a logic product of a reading state signal of each of the EEPROM chips is outputted to an external portion of the memory card as a signal indicative of the reading operation of the memory card so that the reading operation can be monitored.

In accordance with an eleventh construction of the present invention, the memory card further comprises means for switching an enable operation of each of the EEPROM chips to continuously perform the reading operation at a data reading time every time the number of memory blocks each setting a data reading signal inputted to the memory card is counted.

In accordance with a twelfth construction of the present invention, a card terminal for monitoring the reading state signal can be commonly used with respect to the EEPROM chips and the memory card further comprises means for switching monitor signals at reading and writing times of data.

In accordance with a thirteenth construction of the present invention, the switching means for switching the chip enable operation can be switched at writing and reading times of data.

In accordance with a fourteenth construction of the present invention, the above object can be also achieved by a memory card having a plurality of EEPROM chips each capable of reading and writing data in a memory block unit; the memory card comprising means for allocating a memory address to each of the EEPROM chips such that a change in memory address from an access side is continuously provided when the memory card is accessed between a plurality of EEPROM chips.

In accordance with a fifteenth construction of the present invention, the number of EEPROM chips mounted on the memory card is set to an even number.

In accordance with a sixteenth construction of the present invention, a minimum data erasing unit number is set to a product of the number of EEPROM chips within the memory card, the number of data within a memory block, and an arbitrary number.

In accordance with a seventeenth construction of the present invention, when a defective bit is caused in any one of the EEPROM chips, the entire minimum data erasing unit including this defective bit is set to a defective area.

In accordance with an eighteenth construction of the present invention, the memory card further comprises a memory area capable of storing data in the defective area.

As mentioned above, in accordance with the first construction of the memory card of the present invention, it is possible to monitor plural EEPROM chips as to whether a data writing operation is performed for each of the EEPROM chips. Accordingly, the writing operation of the memory card can be efficiently controlled at a high speed.

In the second construction of the present invention, a writing state of each of the plural EEPROM chips performing the writing operation is monitored from an EEPROM chip firstly starting the data writing operation. Accordingly, for example, the writing state can be monitored at a high speed and the writing operation can be performed at a high speed in comparison with a case in which a signal provided by carrying out a logic product is outputted to the exterior of the memory card.

In the third construction of the present invention, a writing state of each of the EEPROM chips within the memory card can be monitored by a data bus of the memory card so that the writing operation can be more efficiently performed.

In the fourth construction of the present invention, writing commands can be independently set with respect to each of the EEPROM chips so that the writing operation can be performed at a higher speed.

In the fifth construction of the present invention, each of the EEPROM chips is selected within the memory card at a data writing time so that a load on the side of an accessed system is reduced.

In the sixth construction of the present invention, each of EEPROM chips is selected such that a memory block reading operation can be continuously performed. Accordingly, the memory card can be efficiently read at a high speed.

In the seventh construction of the present invention, an address setting cycle from the systematic side can be reduced so that the memory card can be accessed at a higher speed.

In the eighth construction of the present invention, a command setting cycle from the systematic side can be reduced so that the memory card can be accessed at a higher speed.

In the ninth construction of the present invention, an operating status of each of the EEPROM chips can be monitored so that an operation of the memory card can be finely controlled from the systematic side.

In the tenth construction of the present invention, a ready/busy signal indicative of a reading state of the memory card can be efficiently read.

In the eleventh construction of the present invention, a chip selecting function is fulfilled within the memory card at a data reading time so that a load on the systematic side can be reduced.

In the twelfth construction of the present invention, an operating state of the memory card can be monitored without adding any new signal line so that a load on the systematic side can be reduced.

In the thirteenth construction of the present invention, means for selecting each of the EEPROM chips are automatically switched at data writing and reading times so that a load on the systematic side can be reduced.

In the fourteenth construction of the present invention, a change in memory address of a memory card seen from a systematic side can be continuously provided even when the memory card is accessed between EEPROM chips. Accordingly, file control can be facilitated in a cluster unit on the systematic side even when a data writing operation is performed at a high speed.

In the fifteenth construction of the present invention, the address change can be continuously provided by setting the number of used EEPROM chips to an even number such as $2^n$ even when the memory card is accessed between the EEPROM chips at a parallel writing time. Accordingly, file control can be facilitated on the systematic side.

In the sixteenth construction of the present invention, data can be erased from the memory card at a high speed by setting a memory block unit between plural EEPROM chips to a minimum data erasing unit. Accordingly, it is possible to hold continuity of data recorded onto the memory card.

In the seventeenth construction of the present invention, a load of file control on the systematic side can be reduced by setting the minimum data erasing unit to a defective area.

In the eighteenth construction of the present invention, data in the defective area are stored to another memory area so that safe file control can be performed.

Further objects and advantages of the present invention will be apparent from the following description of the preferred embodiments of the present invention as illustrated in the accompanying drawings.

BRIEF DESCRIPTION OF THE DRAWINGS

FIG. 3 is a timing chart showing an operating state of a memory chip in each of operating steps thereof at a data writing time in the above embodiment; and FIG. 4 is a timing chart showing an operating state of a memory chip in each of operating steps thereof at a data reading time in the above embodiment.

DESCRIPTION OF THE PREFERRED EMBODIMENTS

The preferred embodiments of a memory card in the present invention will next be described in detail with reference to the accompanying drawings.

Figure 1:
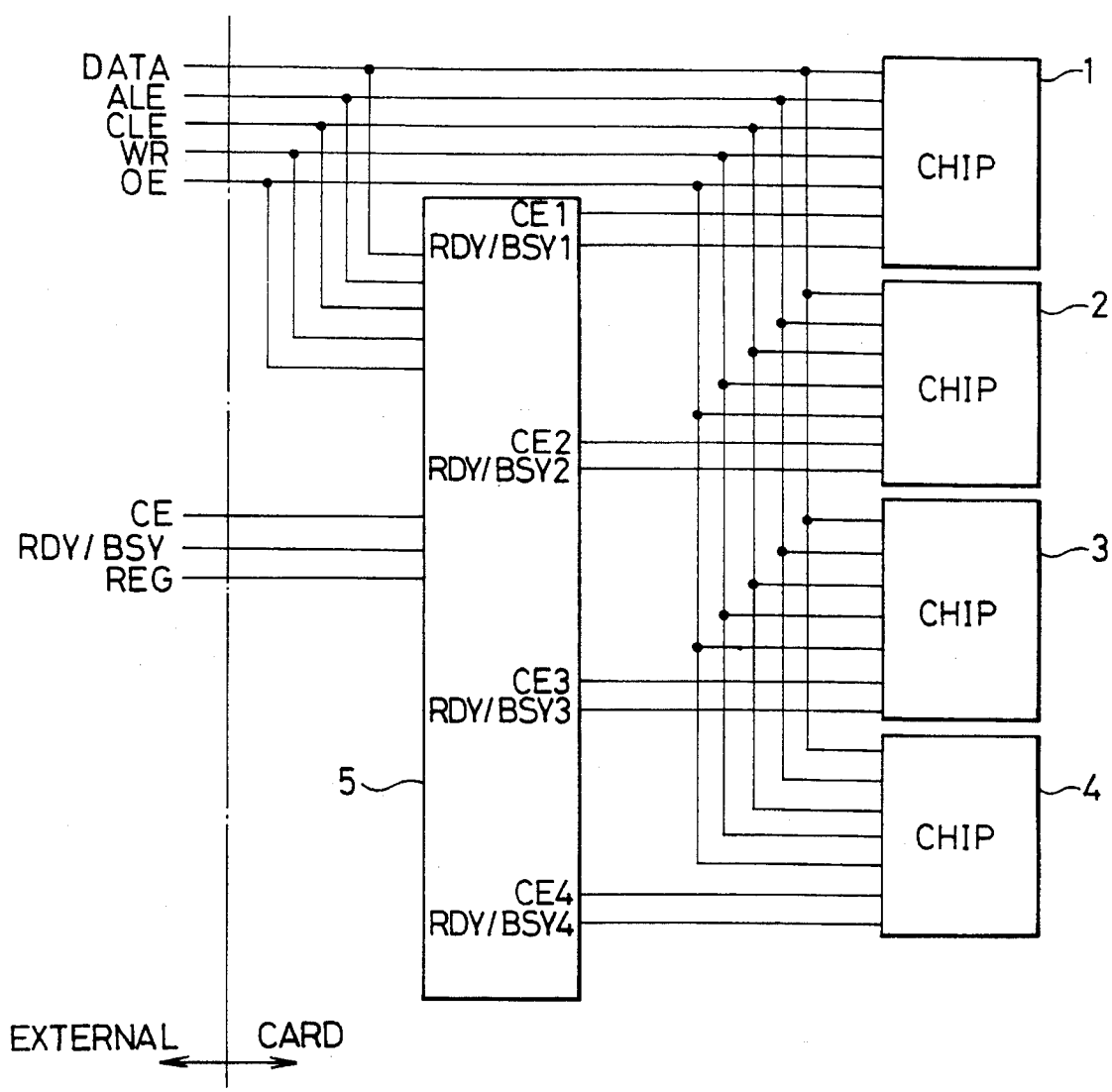
FIG. 1 is an explanatory view showing the construction of a main portion of a memory card in accordance with one embodiment of the present invention.
Figure 2:
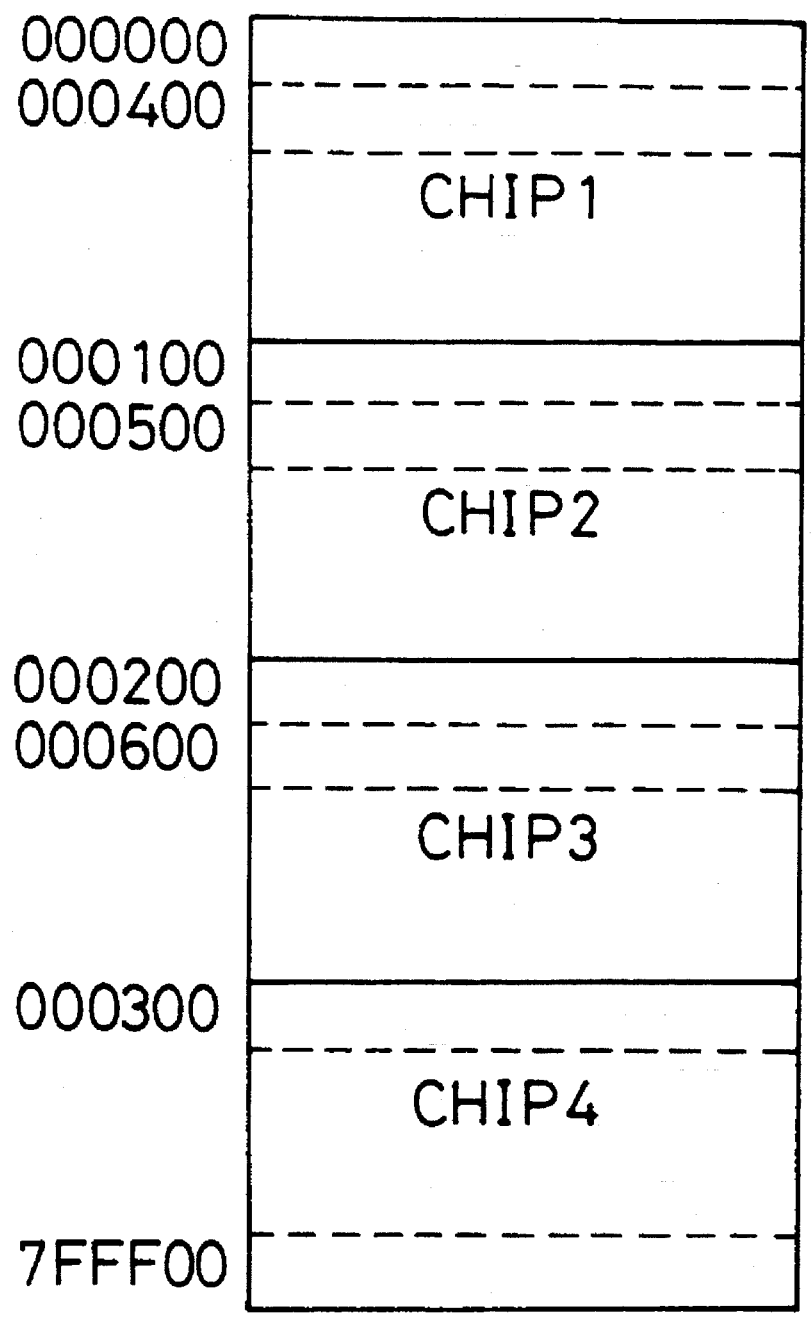
FIG. 2 is an explanatory view of memory allocation in this embodiment.

FIG. 1 is an explanatory view showing the construction of a main portion of a memory card in accordance with one embodiment of the present invention. FIG. 2 is an explanatory view of memory allocation in this embodiment. In this embodiment, a flash type EEPROM card having 8 megabytes (Mbytes) is constructed by using four EEPROM chips 1 to 4 each having 2 megabits (Mbits). The EEPROM chips are selected by a chip selecting section 5 at each of data writing and reading times.

The memory allocation shown in FIG. 2 is used to write and read data from the memory card at a high speed such that memory addresses are continuously changed in a block unit (in a unit of 256 words in this embodiment) between the respective EEPROM chips 1 to 4.

In FIG. 1, ALE, CLE and WR respectively designate an address latch enable signal, a command latch enable signal and a write signal. Each of CE1 to CE4 designates a chip enable signal. RDY/BSY, OE and REG respectively designate a ready/busy signal, an output enable signal and a register select signal.

FIG. 3 is a timing chart showing an operating state of each of memory (EEPROM) chips when data are written to the memory card at a high speed in this embodiment. FIG. 4 is a timing chart showing an operating state of each of memory (EEPROM) chips when data are read from the memory card in this embodiment.

Features of the high speed writing operation of the memory card will first be explained. The writing operation is performed from a memory chip 1. Writing commands are given every time data are completely transferred in a memory block unit. When data (256×4 words) of four memory chips are completely written to the memory card, each of the memory chips is performing the writing operation and a systematic side waits for the next data transfer in view of an RDY/BSY signal of the memory card. In this case, the RDY/BSY signal is outputted as an RDY/BSY1 signal of the memory chip 1 as it is.

The data writing operation can be efficiently performed by monitoring the RDY/BSY1 signal of the memory chip 1 by setting a writing order of data from the systematic side to each of the memory chips to an order of chip 1, chip 2, chip 8, chip 4, chip 1, chip 2, - - - .

A data writing state of each of the memory chips can be monitored for the following reasons. Namely, for example, after the data writing operation of the memory chip i is performed, no data can be transferred to the memory chip 2 if no completion of the data writing operation of the memory chip 2 is known.

In a method for selecting each of the memory chips at a data writing time, the memory chips are selectively switched every time address setting means and writing commands are inputted to the memory card.

A data reading operation of the memory card will next be explained. An address setting operation of the memory card at a data reading time is similar to that at the data writing time. In an operation peculiar to the data reading time, an RDY/BSY output signal of the memory card is set to an output signal provided by carrying out a logic product (logical AND) of outputs of RDY/BSY1 to RDY/BSY4 signals of the respective memory chips. Further, the memory chips within the memory card are selectively switched every time the address setting means and an OE signal are inputted to the memory card by the number of memory blocks such as 256 in this embodiment. In this case, no OE signal inputted to read an operating status of the memory card is counted.

As mentioned above, the RDY/BSY output signal of the memory card is set to an output signal provided by carrying out the logic product (logical AND) of outputs of RDY/BSY1 to RDY/BSY4 signals of the respective memory chips. This is because the data reading operation is performed at a considerably high speed in comparison with the data writing operation in the case of a flash type EEPROM. Namely, the data reading operation is performed at a high speed by checking the RDY/BSY signals of the four memory chips as one unit in comparison with a case in which it is judged whether a status reading operation is performed or not every one memory chip. Further, a load on the systematic side can be reduced by checking the RDY/BSY signals of the four memory chips as one unit.

In this embodiment, memory allocation of the memory card is provided as shown in FIG. 2 to enable the high speed writing operation. Accordingly, a memory block unit between a plurality of memory chips is desirably set to an erasing unit to erase data from the memory card in a data unit as a whole. Therefore, in this embodiment, a minimum data erasing unit is set to (the number of memory chips within the memory card)× (the number of data within a memory block)×n (n: natural number).

A minimum defective control unit in the memory card is set to be equal to the minimum data erasing unit. Further, defective control information is stored to a memory of a different kind within the memory card.

As mentioned above, in accordance with a first construction of a memory card of the present invention, it is possible to monitor plural EEPROM chips as to whether a data writing operation is performed or not every one of the EEPROM chips. Accordingly, the writing operation of the memory card can be efficiently performed at a high speed.

In a second construction of the present invention, the monitoring operation can be performed from an EEPROM chip firstly starting the data writing operation. Accordingly, for example, the writing operation can be performed at a high speed in comparison with a case in which a signal provided by carrying out a logic product is outputted to the exterior of the memory card.

In a third construction of the present invention, a writing state of each of the EEPROM chips within the memory card can be monitored by a data bus of the memory card so that the writing operation can be more efficiently performed.

In a fourth construction of the present invention, writing commands can be independently set with respect to each of the EEPROM chips so that the writing operation can be performed at a higher speed.

In a fifth construction of the present invention, a chip selecting function is fulfilled within the memory card at a data writing time so that a load on the side of an accessed system can be reduced.

In a sixth construction of the present invention, each of EEPROM chips can be selected such that a memory block reading operation can be continuously performed. Accordingly, a data reading operation of the memory card can be efficiently performed at a high speed.

In a seventh construction of the present invention, an address setting cycle from the systematic side can be reduced so that the memory card can be accessed at a higher speed.

In an eighth construction of the present invention, a command setting cycle from the systematic side can be reduced so that the memory card can be accessed at a higher speed.

In a ninth construction of the present invention, an operating status of each of the EEPROM chips can be monitored so that an operation of the memory card can be finely controlled from the systematic side.

In a tenth construction of the present invention, a signal indicative of a reading state can be efficiently read from the memory card.

In an eleventh construction of the present invention, a chip selecting function is fulfilled within the memory card at a data reading time so that a load on the systematic side can be reduced.

In a twelfth construction of the present invention, an operating state of the memory card can be monitored without adding any new signal line so that a load on the systematic side can be reduced.

In a thirteenth construction of the present invention, means for selecting each of the EEPROM chips can be automatically switched at data writing and reading times so that a load on the systematic side can be reduced.

In a fourteenth construction of the present invention, a change in memory address of a memory card seen from a systematic side can be continuously provided even when the memory card is accessed between EEPROM chips. Accordingly, file control can be facilitated in a cluster unit on the systematic side even when a data writing operation is performed at a high speed.

In a fifteenth construction of the present invention, the address change can be continuously provided even when the memory card is accessed between the EEPROM chips at a parallel writing time. Accordingly, file control can be facilitated on the systematic side.

In a sixteenth construction of the present invention, data can be erased from the memory card at a high speed by setting a memory block unit between plural EEPROM chips to a minimum data erasing unit. Accordingly, it is possible to hold continuity of data recorded onto the memory card.

In a seventeenth construction of the present invention, a load of file control on the systematic side can be reduced by setting the minimum data erasing unit to a defective area.

In an eighteenth construction of the present invention, data in the defective area can be stored to another memory area so that safe and reliable file control can be performed.

Many widely different embodiments of the present invention may be constructed without departing from the spirit and scope of the present invention. It should be understood that the present invention is not limited to the specific embodiments described in the specification, except as defined in the appended claims.

What is claimed is:

1. A memory card having a plurality of EEPROM chips each capable of reading and writing data in a memory block unit;

the memory card comprising:

means for controlling plural parallel writing operations in the block unit to perform data writing operations at a sufficient speed to write compressed moving pictures in real time;

means for selecting each of the plurality of EEPROM chips so that the plurality of EEPROM chips are automatically switched at data writing and reading times so as to reduce a load on a systematic side; and means for receiving an output signal from each of the plurality of EEPROM chips, configured to provide at least one signal indicative of the data writing operations to an exterior portion of the memory card to permit external monitoring as to whether the data writing operations are performed for each of the EEPROM chips.

2. A memory card as claimed in claim 1, wherein a writing state of each of the EEPROM chips can be monitored from a data bus of the memory card.

3. A memory card as claimed in claim 1, wherein address setting means for setting a memory address to each of the EEPROM chips is commonly arranged with respect to each of the EEPROM chips.

4. A memory card as claimed in claim 1, wherein command setting means for setting specified commands to each of the EEPROM chips is commonly arranged with respect to each of the EEPROM chips.

5. A memory card as claimed in claim 1, wherein the memory card further comprises means for setting commands for checking an operating status of each of the EEPROM chips independently with respect to each of the EEPROM chips.

6. A memory card as claimed in claim 1, wherein a writing state of a firstly written EEPROM chip is output to the memory card exterior as a signal indicative of the writing operation so as to be monitored.

7. A memory card as claimed in claim 6, wherein a card terminal for monitoring a reading state signal can be commonly used with respect to the EEPROM chips and the memory card further comprises means for switching monitor signals at reading and writing times of data.

8. A memory card as claimed in claim 1, wherein the memory card further comprises means for independently setting writing commands to each of the EEPROM chips.

9. A memory card as claimed in claim 8, wherein the memory card further comprises means for switching an enable operation of each of the EEPROM chips based on a counting value of said writing commands to continuously perform the writing operation in a unit of plural memory blocks at a data writing time.

10. A memory card as claimed in claim 9, wherein the switching means for switching the chip enable operation can be switched at writing and reading times of data.

11. A memory card having a plurality of EEPROM chips each capable of reading and writing data in a memory block unit;

the memory card comprising:

means for controlling plural parallel writing operations in the block unit to automatically switch between EEPROM chips to enable data writing operations at data writing times sufficient to write compressed moving pictures in real time; and means for controlling continuous block reading operations, configured to automatically switch between the EEPROM chips at data reading times sufficient to read compressed moving pictures in real time, to enable the continuous block reading operations.

12. A memory card as claimed in claim 11, wherein address setting means for setting a memory address to each of the EEPROM chips is commonly arranged with respect to each of the EEPROM chips.

13. A memory card as claimed in claim 11, wherein command setting means for setting specified commands to each of the EEPROM chips is commonly arranged with respect to each of the EEPROM chips.

14. A memory card as claimed in claim 11, wherein the memory card further comprises means for setting commands for checking an operating status of each of the EEPROM chips independently with respect to each of the EEPROM chips.

15. A memory card as claimed in claim 11, wherein a signal provided by carrying out a logic product of a reading state signal of each of the EEPROM chips is outputted to an external portion of the memory card as a signal indicative of the reading operation of the memory card so that the reading operation can be monitored.

16. A memory card as claimed in claim 15, wherein a card terminal for monitoring the reading state signal can be commonly used with respect to the EEPROM chips and the memory card further comprises means for switching monitor signals at reading and writing times of data.

17. A memory card as claimed in claim 11, wherein the memory card further comprises means for switching an enable operation of each of the EEPROM chips to continuously perform the reading operation at a data reading time every time the number of memory blocks each setting a data reading signal inputted to the memory card is counted.

18. A memory card as claimed in claim 17, wherein the switching means for switching the chip enable operation can be switched at writing and reading times of data.

19. A memory card having a plurality of EEPROM chips each capable of reading and writing data in a memory block unit;

the memory card comprising:

means for controlling plural parallel writing operations in the block unit to automatically switch between EEPROM chips to enable data writing operations at data writing times sufficient to write compressed moving pictures in real time;

means for controlling continuous block reading operations, configured to automatically switch between the EEPROM chips at data reading times sufficient to read compressed moving pictures in real time, to enable the continuous block reading operations; and means for allocating a memory address to each of the EEPROM chips such that a change in memory address from an access side is continuously provided when the memory card is accessed between a plurality of EEPROM chips for the reading and writing operations.

20. A memory card as claimed in claim 19, wherein the number of EEPROM chips mounted on the memory card is set to an even number.

21. A memory card as claimed in claim 19, wherein a minimum data erasing unit number is set to a product of the number of EEPROM chips within the memory card, the number of data within a memory block, and an arbitrary number.

22. A memory card as claimed in claim 21, wherein, when a defective bit is caused in any one of the EEPROM chips, said entire minimum data erasing unit including this defective bit is set to a defective area.

23. A memory card as claimed in claim 22, wherein the memory card further comprises a memory area capable of storing data in said defective area.

* * * * *

UNITED STATES PATENT AND TRADEMARK OFFICE
CERTIFICATE OF CORRECTION

PATENT NO. :  5,513,138
DATED      :  April 30, 1996
INVENTOR(S) : Katsuhiko MANABE and Hiroki FUKUOKA It is certified that error appears in the above-indentified patent and that said Letters Patent is hereby corrected as shown below:

Title page, item [75], delete "Machida" and insert --Tokyo--

Signed and Sealed this

Twenty-seventh Day of August, 1996

Attest:

BRUCE LEHMAN

Attesting Officer        Commissioner of Patents and Trademarks